United States Patent
He et al.

(10) Patent No.: US 12,224,502 B2
(45) Date of Patent: Feb. 11, 2025

(54) ANTENNA-TO-PRINTED CIRCUIT BOARD TRANSITION

(71) Applicant: Aptiv Technologies AG, Schaffhausen (CH)

(72) Inventors: Yuxiao He, Carmel, IN (US); Kenneth Sean Ayotte, Indianapolis, IL (US); Kevin Paul McReynolds, Noblesville, IN (US)

(73) Assignee: Aptiv Technologies AG, Schaffhausen (CH)

( * ) Notice: Subject to any disclaimer, the term of this patent is extended or adjusted under 35 U.S.C. 154(b) by 329 days.

(21) Appl. No.: 17/813,129

(22) Filed: Jul. 18, 2022

(65) Prior Publication Data

US 2023/0119711 A1 Apr. 20, 2023

Related U.S. Application Data

(60) Provisional application No. 63/265,933, filed on Dec. 22, 2021, provisional application No. 63/255,872, filed on Oct. 14, 2021.

(51) Int. Cl.
  *H01Q 7/00* (2006.01)
  *H01P 3/16* (2006.01)
  *H05K 1/02* (2006.01)

(52) U.S. Cl.
  CPC ............. *H01Q 7/00* (2013.01); *H01P 3/16* (2013.01); *H05K 1/024* (2013.01); *H05K 1/0243* (2013.01); *H05K 2201/10098* (2013.01)

(58) Field of Classification Search
  CPC ...... H05K 1/0243; H05K 1/025; H05K 1/024; H05K 1/0245; H05K 2201/10098;
  (Continued)

(56) References Cited

U.S. PATENT DOCUMENTS

| | | |
|---|---|---|
| 2,840,818 A | 6/1958 | Reed et al. |
| 3,462,713 A | 8/1969 | Knerr |
| | (Continued) | |

FOREIGN PATENT DOCUMENTS

| | | |
|---|---|---|
| CA | 2654470 A1 | 12/2007 |
| CN | 1620738 A | 5/2005 |
| | (Continued) | |

OTHER PUBLICATIONS

Bauer, et al., "A wideband transition from substrate integrated waveguide to differential microstrip lines in multilayer substrates", Sep. 2010, pp. 811-813.

(Continued)

*Primary Examiner* — Quan Tra
(74) *Attorney, Agent, or Firm* — Harness, Dickey & Pierce, P.L.C.

(57) ABSTRACT

This document describes techniques, apparatuses, and systems for an antenna-to-printed circuit board (PCB) transition. An apparatus (e.g., a radar system) may include an MMIC or other processor to generate electromagnetic signals. The apparatus can include a PCB that includes multiple layers, a first surface, and a second surface that is opposite and in parallel with the first surface. The PCB can also include a dielectric-filled portion formed between the first surface and second surface. The apparatus can also include a conductive loop located on the first surface and connected to a pair of lines. The apparatus can further include a transition channel mounted on the first surface and positioned over the dielectric-filled portion. The described transition can reduce manufacturing costs and board sizes, reduce energy losses, and support a wide bandwidth.

19 Claims, 8 Drawing Sheets

(58) Field of Classification Search
CPC . H05K 2201/09618; H05K 2201/0959; H05K 2201/09236; H05K 2201/09985; H05K 2201/0715; H01P 3/16; H01Q 7/00
See application file for complete search history.

(56) References Cited

U.S. PATENT DOCUMENTS

| | | | |
|---|---|---|---|
| 3,579,149 A | 5/1971 | Ramsey | |
| 4,157,516 A | 6/1979 | Grijp | |
| 4,453,142 A | 6/1984 | Murphy | |
| 4,562,416 A | 12/1985 | Sedivec | |
| 5,065,123 A | 11/1991 | Heckaman et al. | |
| 5,350,499 A | 9/1994 | Shibaike et al. | |
| 5,414,394 A | 5/1995 | Gamand et al. | |
| 5,637,521 A | 6/1997 | Rhodes et al. | |
| 5,923,225 A | 7/1999 | Santos | |
| 5,929,728 A | 7/1999 | Barnett et al. | |
| 5,982,250 A | 11/1999 | Hung et al. | |
| 5,982,256 A | 11/1999 | Uchimura et al. | |
| 5,986,527 A | 11/1999 | Ishikawa et al. | |
| 6,064,350 A | 5/2000 | Uchimura et al. | |
| 6,072,375 A | 6/2000 | Adkins et al. | |
| 6,127,901 A | 10/2000 | Lynch | |
| 6,414,573 B1 | 7/2002 | Swineford et al. | |
| 6,489,855 B1 | 12/2002 | Kitamori et al. | |
| 6,535,083 B1 | 3/2003 | Hageman et al. | |
| 6,622,370 B1 | 9/2003 | Sherman et al. | |
| 6,658,233 B1 | 12/2003 | Ikeda | |
| 6,788,918 B2 | 9/2004 | Saitoh et al. | |
| 6,794,950 B2 | 9/2004 | Toit et al. | |
| 6,859,114 B2 | 2/2005 | Eleftheriades et al. | |
| 6,867,660 B2 | 3/2005 | Kitamori et al. | |
| 6,958,662 B1 | 10/2005 | Salmela et al. | |
| 6,995,726 B1 | 2/2006 | West et al. | |
| 7,142,165 B2 | 11/2006 | Sanchez et al. | |
| 7,212,164 B2 * | 5/2007 | Miyano | H01Q 9/26 343/893 |
| 7,276,988 B2 | 10/2007 | Stoneham | |
| 7,420,442 B1 | 9/2008 | Forman | |
| 7,439,822 B2 | 10/2008 | Shimura et al. | |
| 7,495,532 B2 | 2/2009 | McKinzie, III | |
| 7,626,476 B2 | 12/2009 | Kim et al. | |
| 7,659,799 B2 | 2/2010 | Jun et al. | |
| 7,886,434 B1 | 2/2011 | Forman | |
| 7,973,616 B2 | 7/2011 | Shijo et al. | |
| 7,994,879 B2 | 8/2011 | Kim et al. | |
| 8,013,694 B2 | 9/2011 | Hiramatsu et al. | |
| 8,089,327 B2 | 1/2012 | Margomenos et al. | |
| 8,159,316 B2 | 4/2012 | Miyazato et al. | |
| 8,395,552 B2 | 3/2013 | Geiler et al. | |
| 8,451,175 B2 | 5/2013 | Gummalla et al. | |
| 8,451,189 B1 | 5/2013 | Fluhler | |
| 8,680,936 B2 | 3/2014 | Purden et al. | |
| 8,692,731 B2 | 4/2014 | Lee et al. | |
| 8,717,124 B2 | 5/2014 | Vanhille et al. | |
| 8,803,638 B2 | 8/2014 | Kildal | |
| 8,948,562 B2 | 2/2015 | Norris et al. | |
| 9,007,269 B2 | 4/2015 | Lee et al. | |
| 9,203,155 B2 | 12/2015 | Choi et al. | |
| 9,246,204 B1 | 1/2016 | Kabakian | |
| 9,258,884 B2 | 2/2016 | Saito | |
| 9,356,238 B2 | 5/2016 | Norris et al. | |
| 9,450,281 B2 | 9/2016 | Kim | |
| 9,647,313 B2 | 5/2017 | Marconi et al. | |
| 9,653,773 B2 | 5/2017 | Ferrari et al. | |
| 9,673,532 B2 | 6/2017 | Cheng et al. | |
| 9,728,852 B2 * | 8/2017 | Hung | H03H 7/38 |
| 9,806,393 B2 | 10/2017 | Kildal et al. | |
| 9,813,042 B2 | 11/2017 | Xue et al. | |
| 9,843,301 B1 | 12/2017 | Rodgers et al. | |
| 9,935,065 B1 | 4/2018 | Baheti et al. | |
| 9,947,981 B1 | 4/2018 | Strassner et al. | |
| 9,991,606 B2 | 6/2018 | Kirino et al. | |
| 9,997,842 B2 | 6/2018 | Kirino et al. | |
| 10,027,032 B2 | 7/2018 | Kirino et al. | |
| 10,042,045 B2 | 8/2018 | Kirino et al. | |
| 10,090,600 B2 | 10/2018 | Kirino et al. | |
| 10,114,067 B2 | 10/2018 | Lam et al. | |
| 10,153,533 B2 | 12/2018 | Kirino | |
| 10,158,158 B2 | 12/2018 | Kirino et al. | |
| 10,164,318 B2 | 12/2018 | Seok et al. | |
| 10,164,344 B2 | 12/2018 | Kirino et al. | |
| 10,218,078 B2 | 2/2019 | Kirino et al. | |
| 10,230,173 B2 | 3/2019 | Kirino et al. | |
| 10,263,310 B2 | 4/2019 | Kildal et al. | |
| 10,312,596 B2 | 6/2019 | Gregoire | |
| 10,320,083 B2 | 6/2019 | Kirino et al. | |
| 10,333,227 B2 | 6/2019 | Kirino et al. | |
| 10,374,323 B2 | 8/2019 | Kamo et al. | |
| 10,381,317 B2 | 8/2019 | Maaskant et al. | |
| 10,381,741 B2 | 8/2019 | Kirino et al. | |
| 10,439,298 B2 | 10/2019 | Kirino et al. | |
| 10,468,736 B2 | 11/2019 | Mangaiahgari | |
| 10,505,282 B2 | 12/2019 | Lilja | |
| 10,534,061 B2 | 1/2020 | Vassilev et al. | |
| 10,559,889 B2 | 2/2020 | Kirino et al. | |
| 10,594,045 B2 | 3/2020 | Kirino et al. | |
| 10,601,144 B2 | 3/2020 | Kamo et al. | |
| 10,608,345 B2 | 3/2020 | Kirino et al. | |
| 10,622,696 B2 | 4/2020 | Kamo et al. | |
| 10,627,502 B2 | 4/2020 | Kirino et al. | |
| 10,651,138 B2 | 5/2020 | Kirino et al. | |
| 10,651,567 B2 | 5/2020 | Kamo et al. | |
| 10,658,760 B2 | 5/2020 | Kamo et al. | |
| 10,670,810 B2 | 6/2020 | Sakr et al. | |
| 10,705,294 B2 | 7/2020 | Guerber et al. | |
| 10,707,584 B2 | 7/2020 | Kirino et al. | |
| 10,714,802 B2 | 7/2020 | Kirino et al. | |
| 10,727,561 B2 | 7/2020 | Kirino et al. | |
| 10,727,611 B2 | 7/2020 | Kirino et al. | |
| 10,763,590 B2 | 9/2020 | Kirino et al. | |
| 10,763,591 B2 | 9/2020 | Kirino et al. | |
| 10,775,573 B1 | 9/2020 | Hsu et al. | |
| 10,811,373 B2 | 10/2020 | Zaman et al. | |
| 10,826,147 B2 | 11/2020 | Sikina et al. | |
| 10,833,382 B2 | 11/2020 | Sysouphat | |
| 10,833,385 B2 | 11/2020 | Mangaiahgari | |
| 10,892,536 B2 | 1/2021 | Fan et al. | |
| 10,957,971 B2 | 3/2021 | Doyle et al. | |
| 10,957,988 B2 | 3/2021 | Kirino et al. | |
| 10,971,824 B2 | 4/2021 | Baumgartner et al. | |
| 10,983,194 B1 | 4/2021 | Patel et al. | |
| 10,985,434 B2 | 4/2021 | Wagner et al. | |
| 10,992,056 B2 | 4/2021 | Kamo et al. | |
| 11,061,110 B2 | 7/2021 | Kamo et al. | |
| 11,088,432 B2 | 8/2021 | Seok et al. | |
| 11,088,464 B2 | 8/2021 | Sato et al. | |
| 11,114,733 B2 | 9/2021 | Doyle et al. | |
| 11,121,475 B2 | 9/2021 | Yang et al. | |
| 11,169,325 B2 | 11/2021 | Guerber et al. | |
| 11,171,399 B2 | 11/2021 | Alexanian et al. | |
| 11,196,171 B2 | 12/2021 | Doyle et al. | |
| 11,201,414 B2 | 12/2021 | Doyle et al. | |
| 11,249,011 B2 | 2/2022 | Challener | |
| 11,283,162 B2 | 3/2022 | Doyle et al. | |
| 11,289,787 B2 | 3/2022 | Yang | |
| 11,349,183 B2 | 5/2022 | Rahiminejad et al. | |
| 11,349,220 B2 | 5/2022 | Alexanian et al. | |
| 11,378,683 B2 | 7/2022 | Alexanian et al. | |
| 11,411,292 B2 | 8/2022 | Kirino | |
| 11,495,871 B2 | 11/2022 | Vosoogh et al. | |
| 11,563,259 B2 | 1/2023 | Alexanian et al. | |
| 11,611,138 B2 | 3/2023 | Ogawa et al. | |
| 11,616,306 B2 | 3/2023 | Brandenburg et al. | |
| 11,626,652 B2 | 4/2023 | Vilenskiy et al. | |
| 2002/0021197 A1 | 2/2002 | Elco | |
| 2004/0069984 A1 | 4/2004 | Estes et al. | |
| 2006/0113598 A1 | 6/2006 | Chen et al. | |
| 2006/0145777 A1 | 7/2006 | Mueller | |
| 2008/0129409 A1 | 6/2008 | Nagaishi et al. | |
| 2008/0150821 A1 | 6/2008 | Koch et al. | |
| 2009/0040132 A1 | 2/2009 | Sridhar et al. | |
| 2009/0207090 A1 | 8/2009 | Pettus et al. | |
| 2009/0243762 A1 | 10/2009 | Chen et al. | |

(56) References Cited

U.S. PATENT DOCUMENTS

| | | | |
|---|---|---|---|
| 2010/0156754 A1* | 6/2010 | Kondou | H01Q 9/0485 |
| | | | 343/911 R |
| 2010/0193935 A1* | 8/2010 | Lachner | H01Q 9/0457 |
| | | | 257/693 |
| 2011/0050356 A1* | 3/2011 | Nakamura | H01P 5/107 |
| | | | 333/26 |
| 2011/0140810 A1 | 6/2011 | Leiba et al. | |
| 2011/0140979 A1 | 6/2011 | Dayan et al. | |
| 2012/0013421 A1 | 1/2012 | Hayata | |
| 2012/0050125 A1 | 3/2012 | Leiba et al. | |
| 2012/0068316 A1 | 3/2012 | Ligander | |
| 2012/0163811 A1 | 6/2012 | Doany et al. | |
| 2012/0242421 A1 | 9/2012 | Robin et al. | |
| 2012/0256707 A1 | 10/2012 | Leiba et al. | |
| 2012/0256796 A1 | 10/2012 | Leiba | |
| 2013/0057358 A1 | 3/2013 | Anthony et al. | |
| 2013/0256849 A1 | 10/2013 | Danny et al. | |
| 2014/0015709 A1 | 1/2014 | Shijo et al. | |
| 2014/0048310 A1 | 2/2014 | Montevirgen et al. | |
| 2014/0091884 A1 | 4/2014 | Flatters | |
| 2014/0106684 A1 | 4/2014 | Burns et al. | |
| 2014/0218246 A1* | 8/2014 | Ishizuka | H01Q 5/335 |
| | | | 343/749 |
| 2015/0097633 A1 | 4/2015 | Devries et al. | |
| 2015/0229017 A1 | 8/2015 | Suzuki et al. | |
| 2015/0295297 A1 | 10/2015 | Cook et al. | |
| 2015/0357698 A1 | 12/2015 | Kushta | |
| 2015/0364804 A1 | 12/2015 | Tong et al. | |
| 2015/0364830 A1 | 12/2015 | Tong et al. | |
| 2016/0043455 A1 | 2/2016 | Seler et al. | |
| 2016/0049714 A1 | 2/2016 | Ligander et al. | |
| 2016/0056541 A1 | 2/2016 | Tageman et al. | |
| 2016/0111764 A1 | 4/2016 | Kim | |
| 2016/0118705 A1 | 4/2016 | Tang et al. | |
| 2016/0204495 A1 | 7/2016 | Takeda et al. | |
| 2016/0276727 A1 | 9/2016 | Dang et al. | |
| 2016/0293557 A1 | 10/2016 | Topak et al. | |
| 2016/0294060 A1* | 10/2016 | Meng | H01Q 5/378 |
| 2016/0301125 A1 | 10/2016 | Kim et al. | |
| 2017/0084554 A1 | 3/2017 | Dogiamis et al. | |
| 2017/0099705 A1 | 4/2017 | Mazzon | |
| 2017/0324135 A1 | 11/2017 | Blech et al. | |
| 2018/0131084 A1 | 5/2018 | Park et al. | |
| 2018/0226709 A1 | 8/2018 | Mangaiahgari | |
| 2018/0226727 A1 | 8/2018 | Sato | |
| 2018/0233465 A1 | 8/2018 | Spella et al. | |
| 2018/0284186 A1 | 10/2018 | Chadha et al. | |
| 2018/0301816 A1 | 10/2018 | Kamo et al. | |
| 2018/0343711 A1 | 11/2018 | Wixforth et al. | |
| 2018/0351261 A1 | 12/2018 | Kamo et al. | |
| 2018/0375185 A1 | 12/2018 | Kirino et al. | |
| 2019/0006743 A1 | 1/2019 | Kirino et al. | |
| 2019/0013563 A1 | 1/2019 | Takeda et al. | |
| 2019/0194452 A1 | 6/2019 | Schrauwen | |
| 2019/0207286 A1 | 7/2019 | Moallem | |
| 2020/0021001 A1 | 1/2020 | Mangaiahgari | |
| 2020/0153108 A1 | 5/2020 | Uemichi | |
| 2020/0220273 A1 | 7/2020 | Ahmadloo | |
| 2020/0235453 A1 | 7/2020 | Lang | |
| 2020/0243967 A1* | 7/2020 | Sipp | H01Q 3/267 |
| 2020/0287293 A1 | 9/2020 | Shi et al. | |
| 2020/0303823 A1* | 9/2020 | Goto | H01P 1/173 |
| 2020/0343612 A1 | 10/2020 | Shi | |
| 2020/0412012 A1 | 12/2020 | Zhao et al. | |
| 2021/0028549 A1 | 1/2021 | Doyle et al. | |
| 2021/0036393 A1 | 2/2021 | Mangaiahgari | |
| 2021/0159577 A1 | 5/2021 | Carlred et al. | |
| 2021/0265736 A1* | 8/2021 | Takahashi | H01Q 21/0043 |
| 2021/0305667 A1 | 9/2021 | Bencivenni | |
| 2021/0367352 A1 | 11/2021 | Izadian et al. | |
| 2022/0094071 A1 | 3/2022 | Doyle et al. | |
| 2022/0109246 A1 | 4/2022 | Emanuelsson et al. | |

FOREIGN PATENT DOCUMENTS

| | | |
|---|---|---|
| CN | 1682404 A | 10/2005 |
| CN | 2796131 | 7/2006 |
| CN | 201383535 | 1/2010 |
| CN | 102696145 A | 9/2012 |
| CN | 103515682 A | 1/2014 |
| CN | 104900956 A | 9/2015 |
| CN | 105098295 A | 11/2015 |
| CN | 105609909 A | 5/2016 |
| CN | 105680133 A | 6/2016 |
| CN | 105958167 A | 9/2016 |
| CN | 106711616 A | 5/2017 |
| CN | 106785424 A | 5/2017 |
| CN | 109716861 A | 5/2019 |
| CN | 109750201 A | 5/2019 |
| CN | 209389219 U | 9/2019 |
| DE | 4241635 A1 | 6/1994 |
| DE | 102016213202 A1 | 1/2018 |
| DE | 102019200893 A1 | 7/2020 |
| EP | 2500978 A1 | 9/2012 |
| EP | 2843758 A1 | 3/2015 |
| EP | 2945222 A1 | 11/2015 |
| EP | 3460903 A1 | 3/2019 |
| GB | 2489950 A | 10/2012 |
| JP | 2000357916 A | 12/2000 |
| JP | 2003243902 A | 8/2003 |
| JP | 2003289201 A | 10/2003 |
| JP | 3923360 B2 | 5/2007 |
| KR | 20030031585 A | 4/2003 |
| KR | 20080044752 A | 5/2008 |
| KR | 1020080044752 A | 5/2008 |
| WO | 2013189513 A1 | 12/2013 |
| WO | 2018003932 A1 | 1/2018 |
| WO | 2018095541 A1 | 5/2018 |
| WO | 2019085368 A1 | 5/2019 |
| WO | 2021122725 A1 | 6/2021 |

OTHER PUBLICATIONS

Deutschmann, et al., "A Full W-Band Waveguide-to-Differential Microstrip Transition", Jun. 2019, pp. 335-338.

Giese, et al., "Compact Wideband Single-ended and Differential Microstrip-to-waveguide Transitions at W-band", Jul. 2015, 4 pages.

Tong, et al., "A Wide Band Transition from Waveguide to Differential Microstrip Lines", Dec. 2008, 5 pages.

Yuasa, et al., "A millimeter wave wideband differential line to waveguide transition using short ended slot line", Oct. 2014, pp. 1004-1007.

"Extended European Search Report", EP Application No. 23167063.9, Sep. 11, 2023, 12 pages.

"Extended European Search Report", EP Application No. 23167836.8, Sep. 11, 2023, 10 pages.

Ferrando-Rocher Miguel et al: "A Half-Mode Groove Gap Waveguide for Single-Layer Antennas in the Millimeter-Wave Band", IEEE Antennas and Wireless Propagation Letters, IEEE, Piscataway, NJ, US, vol. 21, No. 12, Jul. 27, 2022, pp. 2402-2406, XP011928651, ISSN: 1536-1225, DOI: 10.1109/LAWP.2022.3194665.

"Extended European Search Report", EP Application No. 22188348.1, Mar. 14, 2023, 8 pages.

"Foreign Office Action", CN Application No. 201810122408.4, Jan. 30, 2023, 21 pages.

"Foreign Office Action", CN Application No. 202111321802.9, Mar. 31, 2023, 16 pages.

Henawy, et al., "Integrated Antennas in eWLB Packages for 77 GHZ and 79 GHZ Automotive Radar Sensors", 2011 41st European Microwave Conference, Oct. 10, 2011, pp. 1312-1315.

Schellenberg, et al., "CAD Models for Suspended and Inverted Microstrip", IEEE Transactions on Microwave Theory and Techniques, vol. 43, No. 6, Jun. 1995, pp. 1247-1252.

"Extended European Search Report", EP Application No. 22159217.3, Aug. 19, 2022, 11 pages.

"Extended European Search Report", EP Application No. 22170487.7, Sep. 8, 2022, 11 pages.

(56) References Cited

OTHER PUBLICATIONS

"Foreign Office Action", CN Application No. 202111321802.9, Jul. 29, 2023, 17 pages.
"Foreign Office Action", CN Application No. 202210282861.8, Jun. 1, 2023, 13 pages.
"Foreign Office Action", EP Application No. 21203201.5, Jun. 15, 2023, 11 pages.
Ghahramani, et al., "Reducing Mutual Coupling of SIW Slot Array Antenna Using Uniplanar Compact Ebg (UC-EBG) Structure", The 8th European Conference on Antennas and Propagation (EuCAP 2014), Apr. 6, 2014, pp. 2002-2004.
Rajo-Iglesias, et al., "Gap Waveguide Technology for Millimeter-Wave Antenna Systems", IEEE Communications Magazine, vol. 56, No. 7, Jul. 2018, pp. 14-20.
"Extended European Search Report", EP Application No. 18153137.7, Jun. 15, 2018, 8 pages.
"Extended European Search Report", EP Application No. 20166797, Sep. 16, 2020, 11 pages.
"Extended European Search Report", EP Application No. 21203201.5, Apr. 7, 2022, 12 pages.
"Foreign Office Action", CN Application No. 201810122408.4, Jan. 26, 2022, 15 pages.
"Foreign Office Action", CN Application No. 201810122408.4, May 6, 2022, 15 pages.
"Foreign Office Action", CN Application No. 201810122408.4, Jun. 2, 2021, 15 pages.
"Foreign Office Action", CN Application No. 201810122408.4, Sep. 20, 2022, 19 pages.
"Foreign Office Action", CN Application No. 201810122408.4, Oct. 18, 2021, 19 pages.
"Foreign Office Action", CN Application No. 202111321802.9, Nov. 22, 2022, 17 pages.
Dai, et al., "An Integrated Millimeter-Wave Broadband Microstrip-to-Waveguide Vertical Transition Suitable for Multilayer Planar Circuits", IEEE Microwave and Wireless Components Letters, vol. 26, No. 11, 2016, pp. 897-899.
Deslandes, et al., "Integrated Transition of Coplanar to Rectangular Waveguides", 2001 IEEE MTT-S International Microwave Sympsoium Digest, pp. 619-622.
Jankovic, et al., "Stepped Bend Substrate Integrated Waveguide to Rectangular Waveguide Transitions", Jun. 2016, 2 pages.
Tong, et al., "A Vertical Transition Between Rectangular Waveguide and Coupled Microstrip Lines", IEEE Microwave and Wireless Components Letters, vol. 22, No. 5, May 2012, pp. 251-253.
Topak, et al., "Compact Topside Millimeter-Wave Waveguide-to-Microstrip Transitions", IEEE Microwave and Wireless Components Letters, vol. 23, No. 12, Dec. 2013, pp. 641-643.
Wang, et al., "Mechanical and Dielectric Strength of Laminated Epoxy Dielectric Graded Materials", Mar. 2020, 15 pages.

\* cited by examiner

ANTENNA-TO-PRINTED CIRCUIT BOARD TRANSITION

CROSS-REFERENCE TO RELATED APPLICATIONS

This application claims the benefit under 35 U.S.C 119(e) of U.S. Provisional Application No. 63/265,933, filed Dec. 22, 2021, and U.S. Provisional Application No. 63/255,872, filed Oct. 14, 2021, the disclosures of which are hereby incorporated by reference in their entireties herein.

BACKGROUND

Some devices (e.g., radar systems) use electromagnetic signals to detect and track objects. The electromagnetic signals are transmitted and received using one or more antennas. The electromagnetic signals are often generated by monolithic microwave integrated circuits (MMICs) or other processors located on the same chip or printed circuit board (PCB) as the antennas. The transition between the PCB and the antenna can impact the performance, size, and cost of radar systems. Precisely controlling the design and arrangement of the antenna-to-PCB transition can ensure optimal radar performance while preserving a small module profile and minimizing manufacturing costs.

SUMMARY

This document describes techniques, apparatuses, and systems for an antenna-to-PCB transition. An apparatus (e.g., a radar system) may include an MMIC or other processor on the PCB to generate electromagnetic signals. The apparatus can include a PCB that includes a first surface (e.g., a conductive layer) and a second surface that are in parallel with one another. The PCB can also include a dielectric-filled portion formed between the first surface and second surface. The apparatus can also include a conductive loop located on the first surface and connected to a pair of input lines. The apparatus can further include a transition channel mounted on the first surface and positioned over the dielectric-filled portion. The described antenna-to-PCB transition can reduce manufacturing costs and board sizes, reduce energy losses, and support a wide bandwidth.

This document also describes methods performed by the above-summarized techniques, apparatuses, and systems, and other methods set forth herein, as well as means for performing these methods.

This Summary introduces simplified concepts related to an antenna-to-PCB transition, which are further described in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of an antenna-to-PCB transition are described in this document with reference to the following figures. The same numbers are often used throughout the drawings to reference like features and components:

FIGS. 2-1 through 2-4 illustrate perspective views, a top view, and a side view of an antenna-to-PCB transition;

FIG. 3 illustrates simulated results of the described antenna-to-PCB transition;

FIG. 4 illustrates a top view of an antenna-to-PCB transition with a differential-to-single ended configuration.

DETAILED DESCRIPTION

Overview

Figure 1:
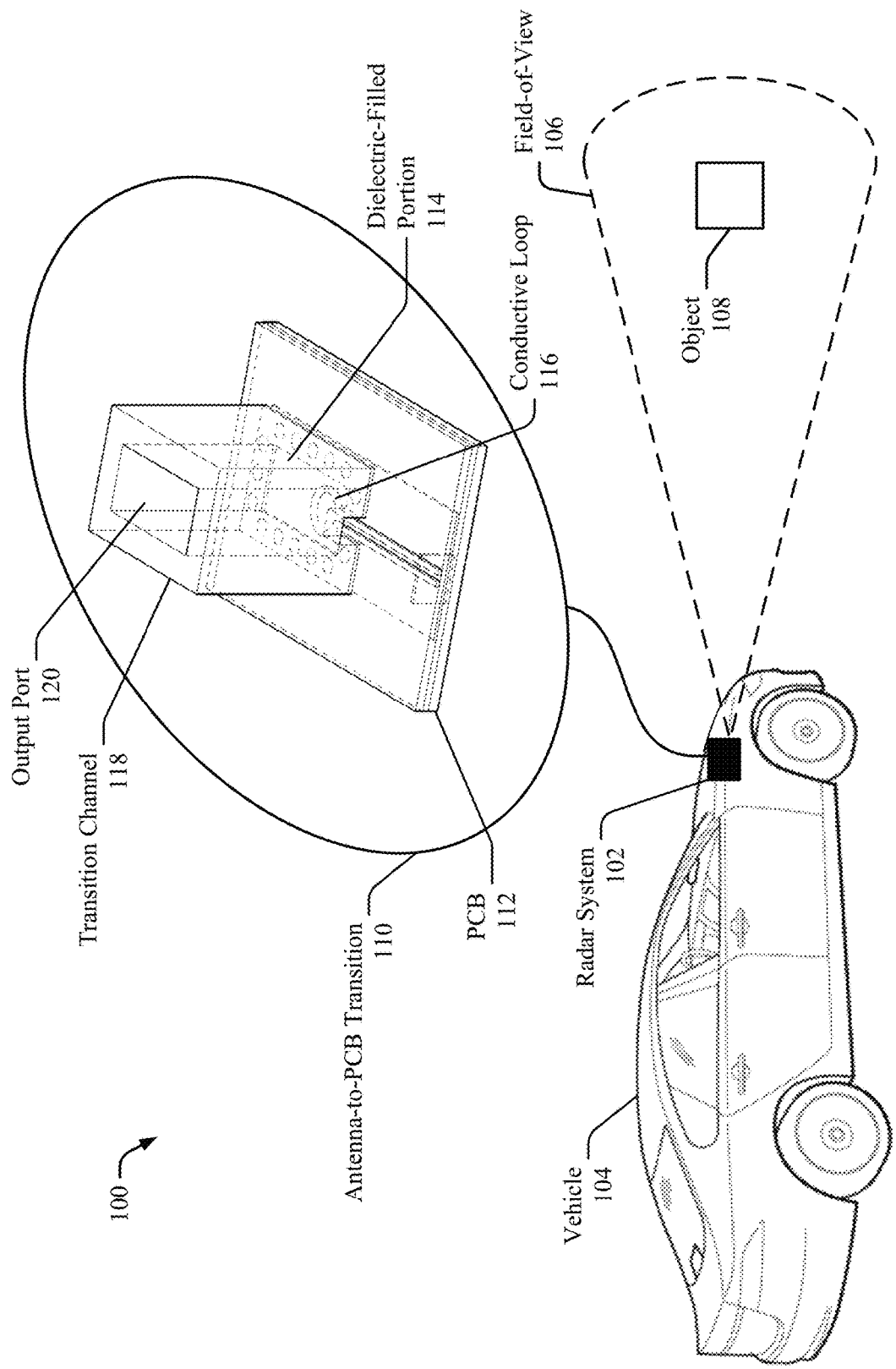
FIG. 1 illustrates an example environment in which a radar system with an antenna-to-PCB transition is used on a vehicle.

In the development of radar systems (e.g., for automotive applications), it is important to find a balance between performance, size, and cost. With recent MMIC technology, passive and active microwave elements are integrated into a single chip that is a few square millimeters in size. The antenna (e.g., antenna arrays), however, which largely impact the range and resolution of the radar system, are generally much larger. Therefore, a careful design and arrangement of the transition between the PCB and the antenna are crucial to ensure optimal radar performance while preserving a small profile and minimizing manufacturing costs.

There are several major concerns for evaluating a transition design: reflection loss, transmission loss, operational bandwidth, manufacturing robustness, and cost. Reflection loss is due to impedance mismatch. Transmission loss includes dissipative and radiation losses, which can occur from long routing and cause poor isolation between channels. Wider bandwidth is preferred to accommodate frequency shifts caused by manufacturing errors and tolerances. For mass production of radar systems, the transition design must be economical and robust enough against normal manufacturing tolerances. Lastly, miniaturization of transition designs and overall radar packaging have become increasingly important because they allow for easier layouts, shorter routing, and compact module profiles.

To achieve a compact design, PCBs can utilize through-board vertical transitions to transfer electrical signals (e.g., electromagnetic (EM) energy) from feeding lines from an MMIC on one side of the PCB to inputs of an antenna or a radio-frequency (RF) structure on another side of the PCB. A through-board vertical transition allows a separate antenna board to be placed back-to-back with the MMIC board, reducing the overall size of the PCB compared to a planar approach (discussed below). This design transforms an on-board planar feeding line to a through-board equivalent dielectric-filled waveguide which consists of a series of rectangular metal openings etched on each conductive or metal layer and through-board via fences surrounding the metal openings. There are, however, several challenges associated with vertical transitions and the accuracy of their fabrication, including etching and layer alignment. In addition, these transitions can have relatively high transmission loss. As a result, vertical transitions may reduce the power delivered to the antenna or RF structure, limiting operations of the PCB module (e.g., limiting radar detections of a nearby object). In addition, vertical transitions often cannot be fabricated with low-cost PCB materials and instead may require high-cost, low-loss material and expensive fabrication techniques.

Designing a vertical transition to enable low transmission loss can be a further challenge. An electronic device may require the vertical transition to transport power associated with the EM energy to the antenna or RF structure to perform operations (e.g., radar detection of a nearby object).

These operations, however, may be inhibited by transmission loss if the power supplied to the antenna or RF structure is insufficient. For example, when the EM energy encounters a vertical transition, there may be an impedance mismatch that results in reduced or insufficient power transfer (e.g., transmission loss) to the antenna. Further, operations of PCB components (e.g., transport, storage, or processing of electrical signals by an integrated circuit (IC), transistors, diodes, capacitors, resistors, and so forth) may become inhibited or permanently damaged by transmission loss due in part to heating of the PCB via dissipation of the EM energy.

The performance of vertical transitions is also sensitive to manufacturing tolerances. The multi-layer design of vertical transitions often includes several critical geometries that are susceptible to manufacturing errors, such as over/under-etching, layer misalignment, and board thickness variations. These manufacturing variables can result in significant decreases in energy passing through the vertical transition due to shifted operational bandwidth and impedance mismatch.

To mitigate these challenges, some PCBs do not include vertical transitions. Instead, the PCB components may be located on the same board and same side as the antenna or RF structure. Planar transitions can be fabricated on the same PCB where both the MMIC and antenna are located. Depending on the type of feeding structures of the MMIC and antenna, the design variants include a microstrip-to-differential, microstrip-to-substrate integrated waveguide (SIW), and a differential-to-SIW design. For example, the IC may be located next to the antenna, eliminating a need for vertical transitions. There are, however, several drawbacks to planar transitions. For example, the IC needs to be shielded to reduce interaction with the antenna. The PCB may also need to be larger to allow for mounting of the PCB components on the same side. There can be additional costs associated with this type of PCB if a dual-sided surface-mount technology (SMT) process is required.

To address these challenges, this document describes an upward transition that utilizes a surface-mount transition channel for vertical transitions from one PCB to a waveguide. The antenna-to-PCB transition described herein utilizes a dielectric-filled portion of the PCB on which the MMIC is mounted, a conductive loop, and a transition channel mounted on a surface of the PCB and positioned over the dielectric-filled portion. The shape and size of the components of the described antenna-to-PCB transition are designed to reduce transmission losses, lower manufacturing costs, and improve performance. The transmission loss is reduced by utilizing a low-loss air waveguide as the transition channel and a shortened routing length. The slimmer topology also makes the layout arrangement more flexible and smaller. In addition, the antenna board acts as a shield for the MMIC, eliminating the costs for a separate shielding component.

The antenna-to-PCB transition described herein can also reduce costs associated with the PCB fabrication. The transition channel and dielectric-filled portion reduce the need for precise alignment of the vertical transitions in a multi-layer PCB. As a result, low-cost PCB materials may be integrated into layers of the PCB. For example, a hybrid PCB stack-up includes a top layer that comprises a material that is distinct from materials used in remaining layers.

This example antenna-to-PCB transition is just one example of the described techniques, apparatuses, and systems of an antenna-to-PCB transition. This document describes other examples and implementations.

Operating Environment

FIG. 1 illustrates an example environment 100 in which a radar system 102 with an antenna-to-PCB transition 110 is used on a vehicle 104. The vehicle 104 may use the antenna-to-PCB transition 110 to enable operations of the radar system 102 that is configured to determine a proximity, an angle, or a velocity of one or more objects 108 in the proximity of the vehicle 104.

Although illustrated as a car, the vehicle 104 can represent other types of motorized vehicles (e.g., a motorcycle, a bus, a tractor, a semi-trailer truck, or construction equipment), non-motorized vehicles (e.g., a bicycle), railed vehicles (e.g., a train or a trolley car), watercraft (e.g., a boat or a ship), aircraft (e.g., an airplane or a helicopter), or spacecraft (e.g., satellite). In general, manufacturers can mount the radar system 102 to any moving platform, including moving machinery or robotic equipment. In other implementations, other devices (e.g., desktop computers, tablets, laptops, televisions, computing watches, smartphones, gaming systems, and so forth) may incorporate the radar system 102 with the antenna-to-PCB transition 110 and support techniques described herein.

In the depicted environment 100, the radar system 102 is mounted near or integrated within a front portion of vehicle 104 to detect object 108 and avoid collisions. The radar system 102 provides a field-of-view 106 towards one or more objects 108. The radar system 102 can project the field-of-view 106 from any exterior surface of the vehicle 104. For example, vehicle manufacturers can integrate the radar system 102 into a bumper, side mirror, headlights, rear lights, or any other interior or exterior location where the object 108 requires detection. In some cases, the vehicle 104 includes multiple radar systems 102, such as a first radar system 102 and a second radar system 102 that provide a larger field-of-view 106.

In general, vehicle manufacturers can design the locations of one or more radar systems 102 to provide a particular field-of-view 106 that encompasses a region of interest, including, for instance, in or around a travel lane aligned with a vehicle path. Example fields-of-view 106 include a 360-degree field-of-view, one or more 180-degree fields-of-view, one or more 90-degree fields-of-view, and so forth, which can overlap or be combined into a field-of-view 106 of a particular size.

The object 108 is composed of one or more materials that reflect radar signals. Depending on the application, the object 108 can represent a target of interest. In some cases, the object 108 can be a moving object or a stationary object. The stationary objects can be continuous (e.g., a concrete barrier, a guard rail) or discontinuous (e.g., a traffic cone) along a road portion.

The radar system 102 emits electromagnetic radiation by transmitting one or more electromagnetic signals or waveforms via an antenna (not illustrated). In the environment 100, the radar system 102 can detect and track the object 108 by transmitting and receiving one or more radar signals. For example, the radar system 102 can transmit electromagnetic signals between 100 and 400 gigahertz (GHz), between 4 and 100 GHz, or between approximately 70 and 80 GHz.

The radar system 102 can determine a distance to the object 108 based on the time it takes for the signals to travel from the radar system 102 to the object 108 and from the object 108 back to the radar system 102. The radar system 102 can also determine the location of object 108 in terms of an angle based on the direction of a maximum amplitude echo signal received by the radar system 102.

The radar system 102 can be part of the vehicle 104. Vehicle 104 can also include at least one automotive system that relies on data from the radar system 102, including a driver-assistance system, an autonomous-driving system, or a semi-autonomous-driving system. The radar system 102 can include an interface to the automotive systems. The radar system 102 can output, via the interface, a signal based on electromagnetic energy received by the radar system 102.

Generally, the automotive systems use radar data provided by the radar system 102 to perform a function. For example, the driver-assistance system can provide blind-spot monitoring and generate an alert indicating a potential collision with the object 108 detected by the radar system 102. In this case, the radar data from the radar system 102 indicates when it is safe or unsafe to change lanes. The autonomous-driving system may move the vehicle 104 to a particular location on the road while avoiding collisions with the object 108 detected by the radar system 102. The radar data provided by the radar system 102 can provide information about the distance to and the location of the object 108 to enable the autonomous-driving system to perform emergency braking, perform a lane change, or adjust the speed of the vehicle 104.

The radar system 102 generally includes an MMIC (not illustrated) and at least one antenna, including the antenna-to-PCB transition 110, to transmit and/or receive electromagnetic signals. The MMIC includes components for emitting electromagnetic signals and detecting reflected electromagnetic signals.

The radar system 102 also includes one or more processors (not illustrated) and computer-readable storage media (CRM) (not illustrated). The processor can be a microprocessor or a system-on-chip. The processor executes instructions stored within the CRM. As an example, the processor can control the operation of the transmitter. The processor can also process electromagnetic energy received by the antenna and determine the location of object 108 relative to the radar system 102. The processor can also generate radar data for automotive systems. For example, the processor can control, based on processed electromagnetic energy from the antenna, an autonomous or semi-autonomous driving system of the vehicle 104.

The antenna-to-PCB transition 110 includes a PCB 112, a dielectric-filled portion 114 of the PCB 112, a conductive loop 116, and a transition channel 118. The dielectric-filled portion 114 conducts EM energy radiated through the PCB 112 to reflect off a bottom layer and combine with the EM energy radiated vertically through the transition channel 118. As described in greater detail with respect to FIGS. 2-1 through 2-4, the dielectric-filled portion 114 is formed using interfaces, via fences, and a plate. The electrical current flowing along the conductive loop 116 induces magnetic fields that act as a magnetic source to excite EM waves inside the antenna-to-PCB transition 110. The transition channel 118 guides the EM energy upward to an output port 120, where the EM energy can be delivered to an antenna input on a separate PCB. The transition channel 118 can be any solid material, including wood, carbon fiber, fiberglass, metal, plastic, or a combination thereof with inner surfaces of the transition channel 118 coated with a (thin) layer of metal.

This document describes example embodiments of the antenna-to-PCB transition 110 to reduce energy loss and support a wide bandwidth in greater detail with respect to FIGS. 2 through 5. The design of the described antenna-to-PCB transition 110 is also highly customizable to accommodate tight space constraints on the PCB 112 or different antenna designs. In this way, the described antenna-to-PCB transition 110 enables a compact circuitry layout for the radar system 102 to reduce manufacturing costs and transmission losses.

Figures 1, 2:
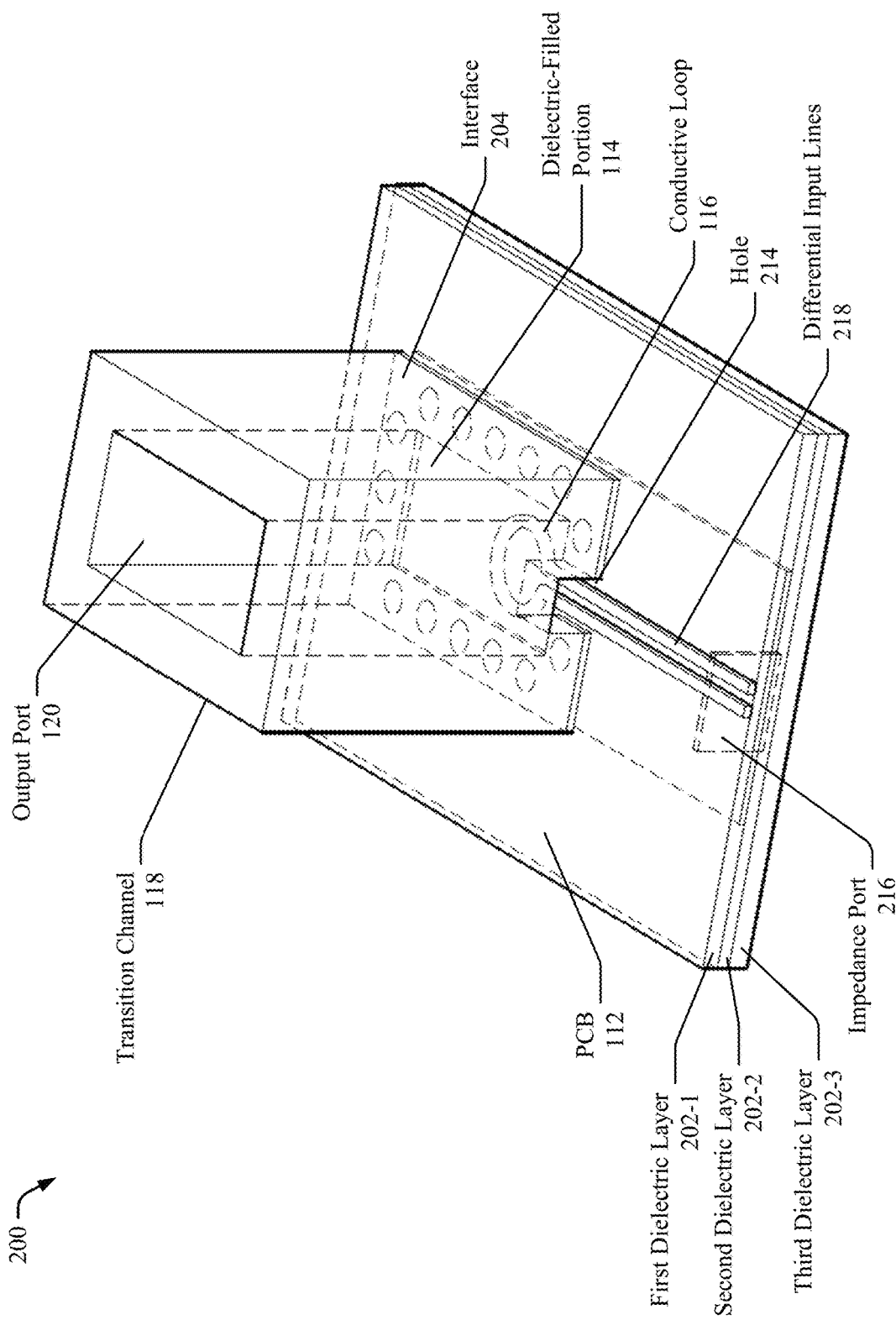
Figure 2:
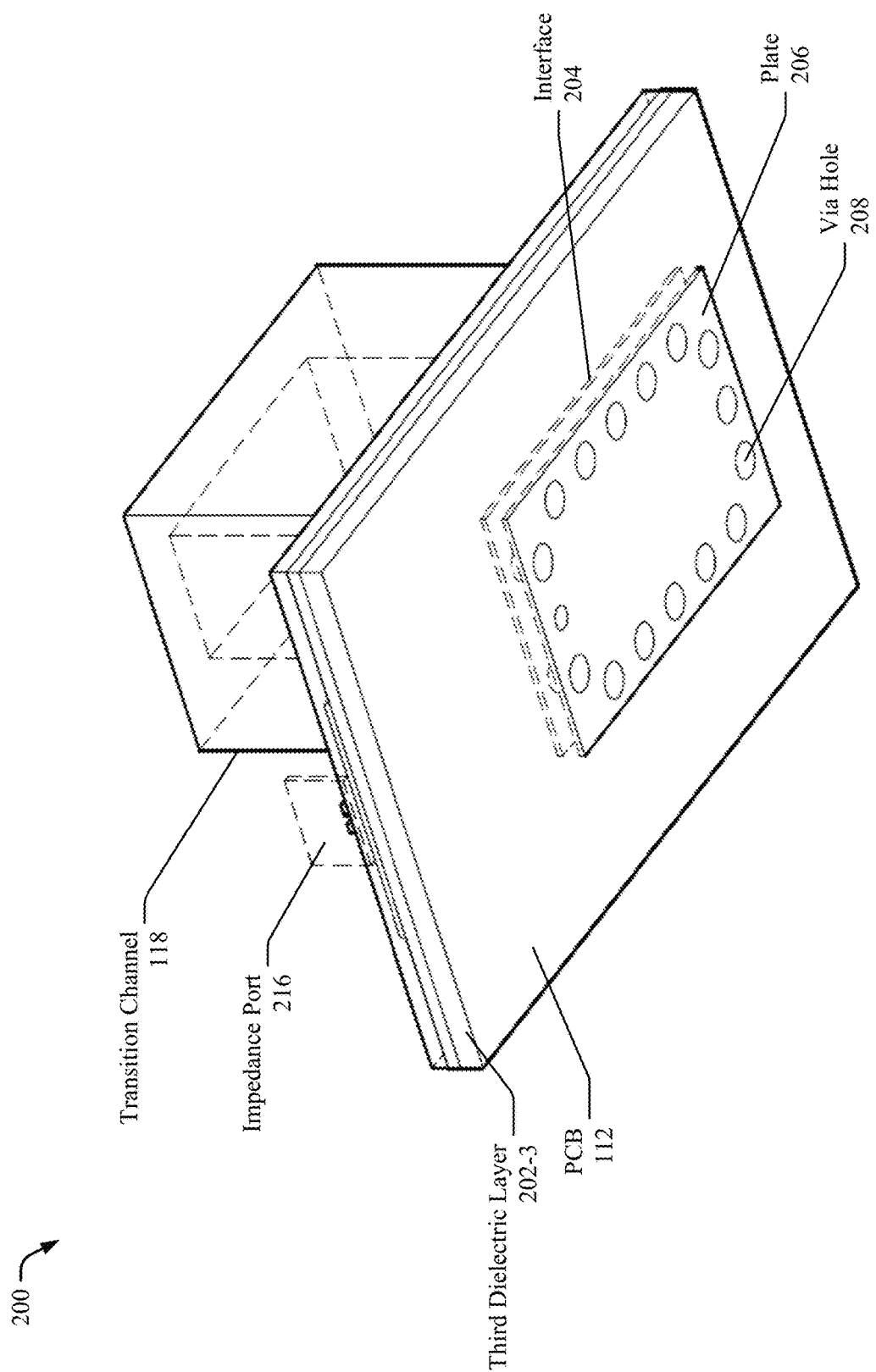
Figures 2, 3:
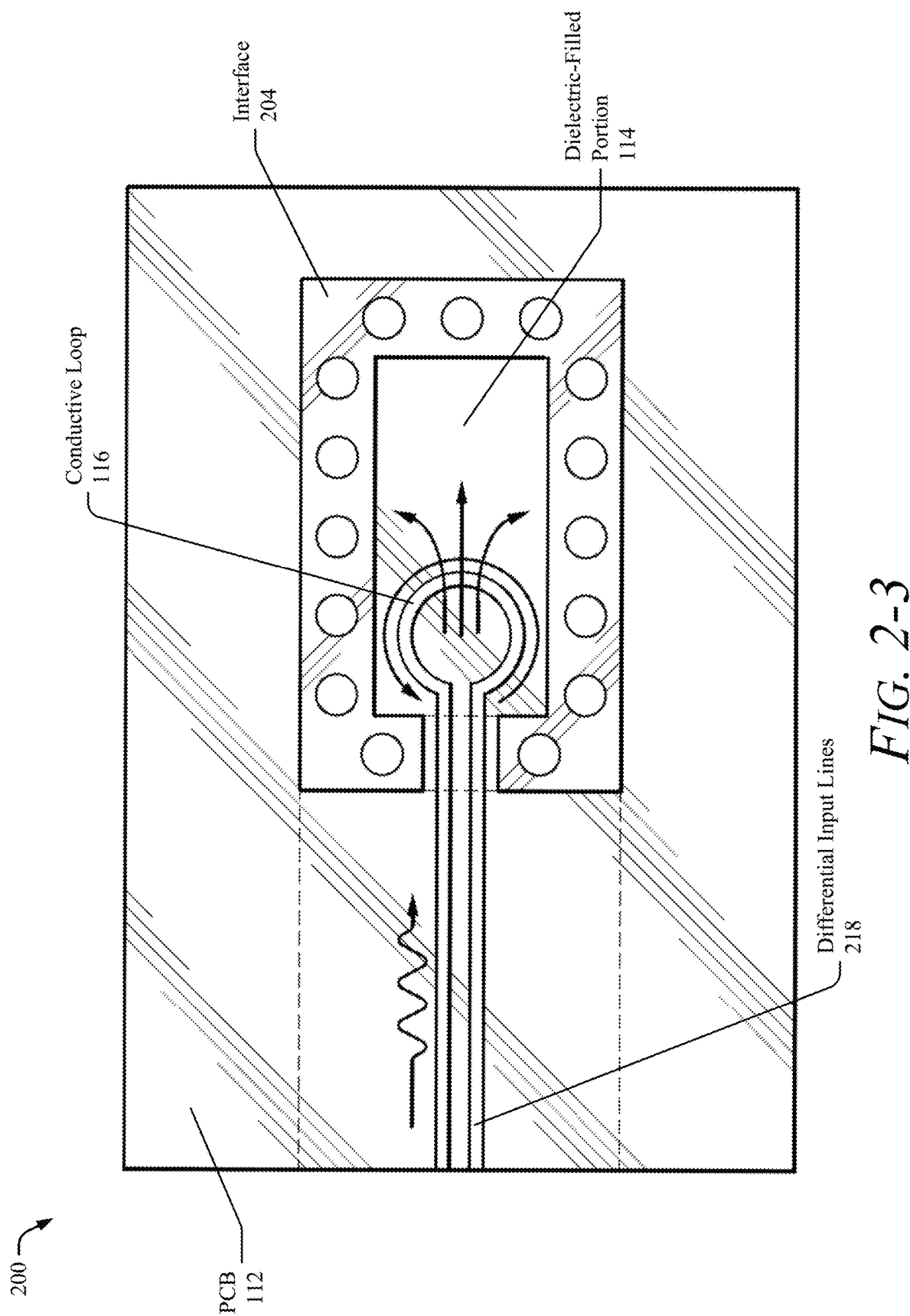
Figures 2, 3, 4:
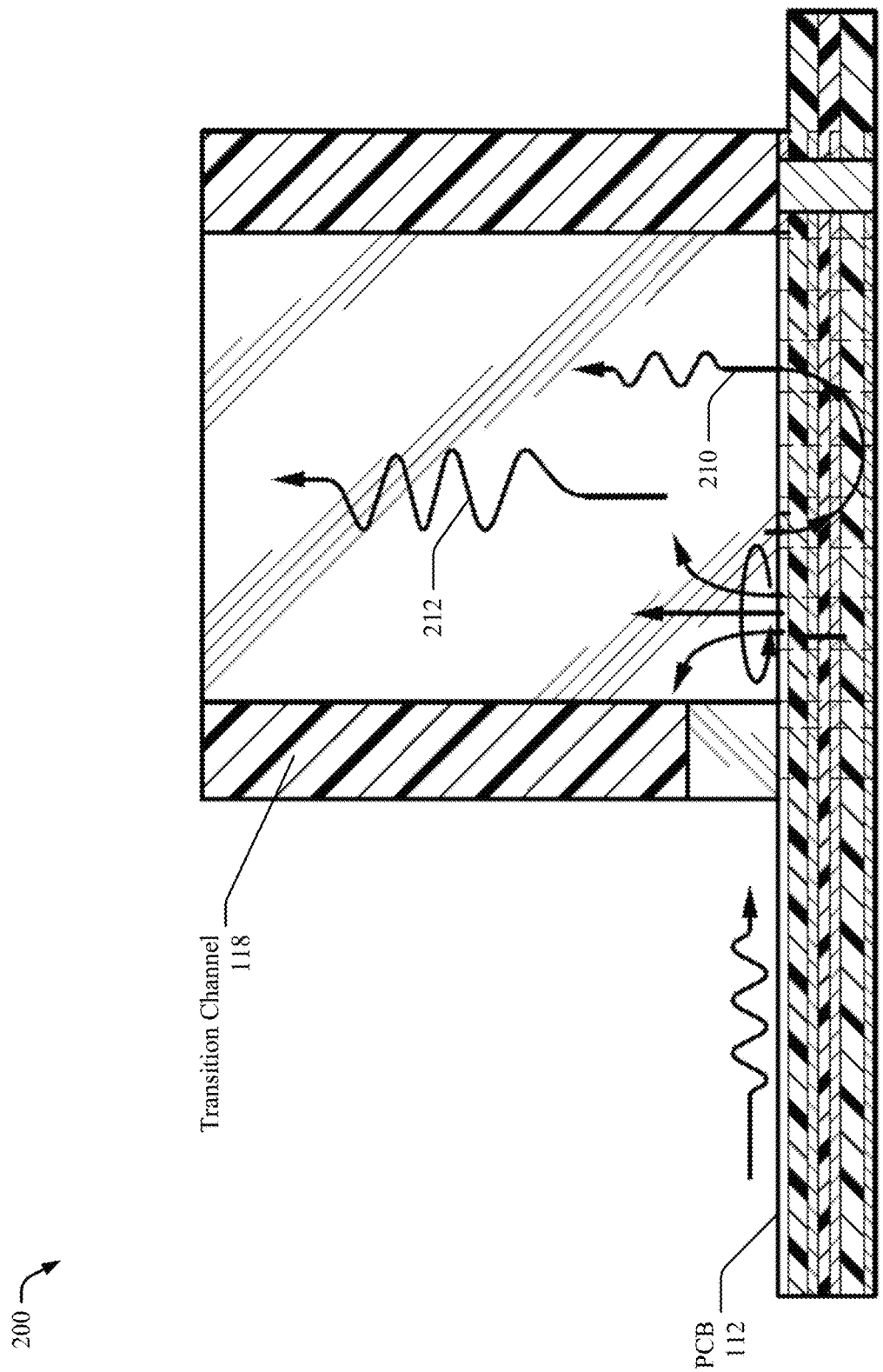
Figure 3:
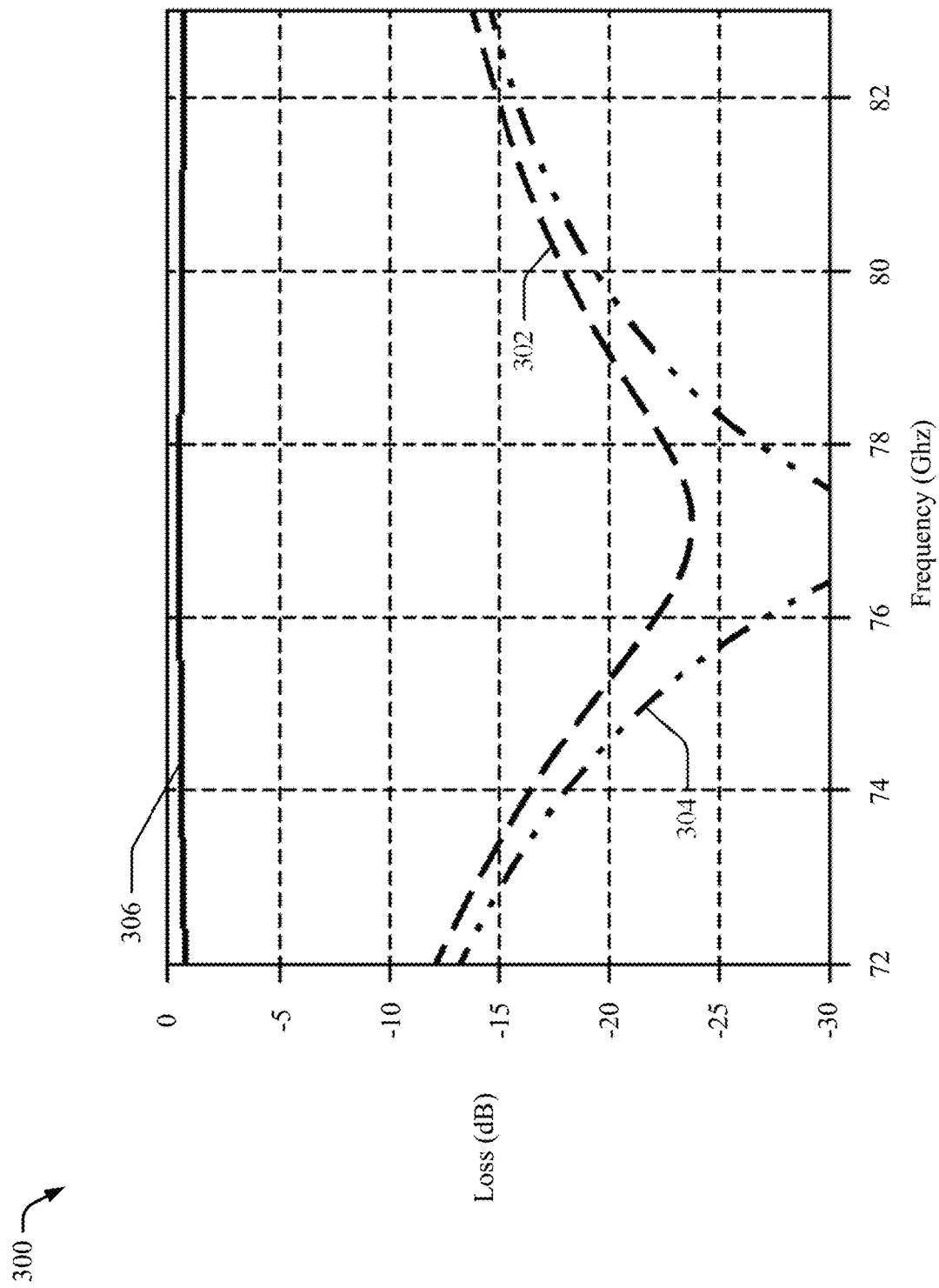
Figure 4:
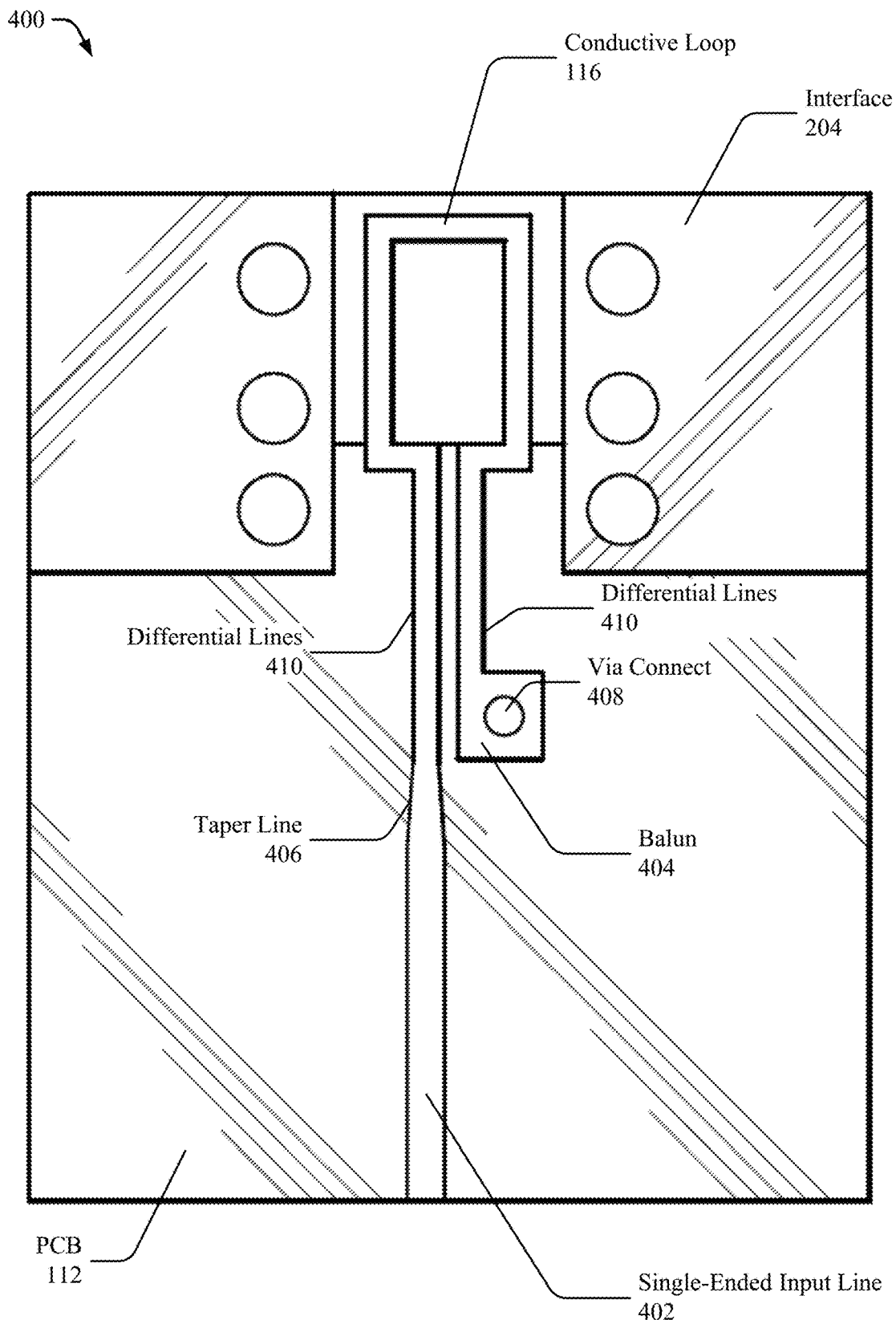

FIGS. 2-1 through 2-4 illustrate perspective views, a top view, and a side view of an example antenna-to-PCB transition 200. The antenna-to-PCB transition 200 is an example of the antenna-to-PCB transition 110 of FIG. 1. FIG. 2-1 illustrates a top perspective view of the antenna-to-PCB transition 200. FIG. 2-2 illustrates a bottom perspective view of the antenna-to-PCB transition. FIGS. 2-3 and 2-4 illustrate a top and side view, respectively, of the antenna-to-PCB transition 200. The antenna-to-PCB transition 200 includes the PCB 112, the dielectric-filled portion 114, the conductive loop 116, and the transition channel 118.

The PCB 112 can include three or more dielectric layers, e.g., a first dielectric layer 202-1, a second dielectric layer 202-2, and a third dielectric layer 202-3. In other implementations, the PCB can include a single dielectric layer with two metal layers. The dielectric-filled portion 114 is part of the PCB 112. In particular, the dielectric-filled portion 114 can be formed by a first interface 204-1 located on or in the first dielectric layer 202-1, a second interface 204-2 located on or in the second dielectric layer 202-2, and a plate 206 located on or in the third dielectric layer 202-3 or on or in the PCB 112 as an internal layer or feature. The first interface 204-1 and the second interface 204-2 have an interior opening that forms a cross-section of the dielectric-filled portion 114 in the first dielectric layer 202-1 or on a surface of the PCB 112. The plate 206 encloses the dielectric-filled portion 114 in a direction perpendicular to the surface of the PCB 112. The first interface 204-1, the second interface 204-2, and the plate 206 can be metal or a metal-plated material. The dielectric-filled portion 114, the first interface 204-1, the second interface 204-2, the interior portion of the first interface 204-1 and the second interface 204-2, and the plate 206 can have an approximately rectangular shape or circular shape to match a profile of the transition channel 118.

As illustrated in FIG. 2-1, the dimensions of the dielectric-filled portion 114—the interior portion of the first interface 204-1 and the second interface 204-2—can approximately match those of the interior portion of the transition channel 118. For example, the dimensions of the dielectric-filled portion 114 can be 1.27 millimeters (mm) by 2.54 mm. Other dimensions for the dielectric-filled portion 114 are also possible. In other implementations, the dimensions of the dielectric-filled portion 114 can differ from the dimensions of the interior portion of the first interface 204-1 and the second interface 204-2. The dimensions of the dielectric-filled portion 114, the first interface 204-1, and the second interface 204-2 can be designed and selected to accommodate specific board layout requirements, MMIC-port topologies, and transition channel sizes, while maintaining impedance matching and low energy loss. In general, the dimensions of the dielectric-filled portion 114 are smaller than conventional waveguides or transition channels to reduce the overall board size and cost of the radar system.

The first interface 204-1, the second interface 204-2, and the plate 206 include multiple via holes 208. The via holes 208 form a via fence that together with the first interface 204-1, the second interface 204-2, and the plate 206 enclose the dielectric-filled portion 114. The via holes 208 are generally closely spaced to form an equivalent wall to the electromagnetic wave excited by the conductive loop 116. In effect, the electromagnetic wave effectively sees the collection of via holes 208 as a metal plate wall that is generally not feasible or is cost prohibitive to create during PCB fabrication. The diameter and spacing of the via holes 208 are designed to minimize or prevent energy leaking through the via fence, which would deteriorate the performance of the antenna-to-PCB transition 200. The ratio between the center-to-center spacing of the via holes 208 and the diameter of the via holes 208 is generally greater than 1.5. Practically, this ratio is bounded by the manufacturing tolerances and cost sensitivities; for example, the via holes 208 cannot be too closely spaced to not be practically possible or cost prohibitive.

The plate 206 encloses the bottom of the dielectric-filled portion 114. An important design consideration is the PCB layer on which to place the plate 206 because it dictates the depth of the dielectric-filled portion 114, which represents the thickness of the PCB 112 from a first surface (e.g., the top surface) of the PCB 112 to the plate 206. The depth of the dielectric-filled portion 114 is generally designed so that the energy 210 reflected off of the plate 206 merges with the upward-transmitting electromagnetic energy 212 from the conductive loop 116 as illustrated in FIG. 2-4. For example, the depth can be designed to be a quarter wavelength of the center operating frequency of the electromagnetic energy or an antenna coupled to the antenna-to-PCB transition 200.

The conductive loop 116 is connected to a pair of differential input lines on the first dielectric layer 202-1. The perimeter length of the conductive loop 116 is generally designed to be close to a full wavelength or half wavelength of the center operating frequency (e.g., 76.5 GHz) of the electromagnetic energy or an antenna coupled to the antenna-to-PCB transition 200 so that the flowing current can resonate. The conductive loop 116 can have various shapes, including approximately rectangular, square, circular, or oval. For example, the shape of the conductive loop 116 can be based on a designer's preference or manufacturing requirements to reduce fabrication errors. The trace width and shape of the conductive loop 116 can also be adjusted to optimize impedance matching to the differential input lines. If sufficient impedance matching is not possible, additional impedance matching stubs can be placed in between the conductive loop 116 and the differential input lines.

The conductive loop 116 is generally placed near the short wall of the transition channel 118 or the dielectric-filled portion 114 to efficiently excite the traveling electromagnetic wave inside the transition channel 118. The intensity of the magnetic flux is generally strongest at the short wall of the transition channel 118 and decays as the conductive loop 116 is placed further away from the short wall.

The transition channel 118 is placed on the first interface 204-1. The transition channel 118 can be filled with various dielectrics, including air. As a result, the transition channel 118 can function as an air waveguide. The transition channel 118 can be made of metal or metal-plated plastic. As discussed above, the opening of the transition channel 118 can be designed based on size, cost, and performance characteristics. The transition channel 118 includes a hole 214 (e.g., a mouse hole) at one side of the short wall to allow the differential input lines to connect to the conductive loop 116. The hole 214 can be sized to be sufficiently large to allow access for the differential input lines while not being too large to leak too much energy. The hole 214 can also be designed and optimized as an impedance matching section between the differential input lines and the conductive loop 116. The dimension and shape flexibility of the transition channel 118 avoids expensive and exacting milling manufacturing processes, while also permitting three-dimensional printing to further reduce manufacturing costs.

In operation, energy from an MMIC (not illustrated in FIG. 2) or another processor is delivered to an impedance port 216. The impedance port 216 can have a supplier-defined or other arbitrary impedance (e.g., 100 ohms). The differential input lines 218 transmit the energy to the conductive loop 116 inside the transition channel 118. The current flowing along the conductive loop 116 induces magnetic fields within the transition channel 118 and the dielectric-filled portion 114 (as illustrated in FIGS. 2-3 and 2-4). The magnetic fields act as the magnetic source to excite the energy-carry traveling waves 210 and 212. In contrast, transitions generally use a direct electric field to excite the electromagnetic energy.

The dielectric-filled portion 114 allows the downward-traveling energy wave to bounce off the plate 206 and merge with the upward-traveling energy wave 212. The transition channel 118 guides the electromagnetic waves 210 and 212 toward the output port 120 that is operably connected to an antenna input on a separate board. In this way, the described antenna-to-PCB transition 200 can achieve a wide bandwidth and a low insertion loss. The antenna-to-PCB transition 200 also achieves significantly reduce transmission losses because of the highly efficient magnetic-coupling excitation by the conductive loop 116. Due to the design flexibility in terms of the shape and size of the conductive loop 116, the dimensions of the dielectric-filled portion 114, and the dimensions of the transition channel 118, the antenna-to-PCB transition 200 provide design freedoms to minimize the size and cost of the PCB 112, reduce the associated transmission losses from routing the differential input lines 218, and alleviate design constraints introduced by traditional waveguides and transition channels.

FIG. 3 illustrates simulated results 300 of the described antenna-to-PCB transition (e.g., the antenna-to-PCB transition 200 of FIGS. 2-1 through 2-4). Lines 302 and 304 illustrate the simulated return loss for the described antenna-to-PCB transition 200. Line 306 illustrates the simulated insertion loss for the antenna-to-PCB transition 200. As illustrated in FIG. 3, the described design experience approximately 11 GHz of −10 dB bandwidth and 8 GHz of −15 dB bandwidth. The insertion loss for the antenna-to-PCB transition 200 can be as low as 0.55 dB at an operating frequency of 76.5 GHz.

FIG. 4 illustrates a top view of an antenna-to-PCB transition 400 with a differential-to-single ended configuration. The antenna-to-PCB transition 400 is an example of the antenna-to-PCB transition 110 of FIG. 1. Similar to the antenna-to-PCB transition 200, the antenna-to-PCB transition 400 includes the PCB 112, the dielectric-filled portion 114 (not illustrated in FIG. 4), the conductive loop 116, and the transition channel 118 (not illustrated in FIG. 4).

The antenna-to-PCB transition 200 was described in the context of a differential input/out MMIC configuration. In contrast, the antenna-to-PCB transition 400 is applicable to single-ended MMIC configurations. The antenna-to-PCB transition 400 includes a single-ended input line 402 from an MMIC (not illustrated) and a balun 404.

The single-ended input line 402 is connected to a taper line 406 that transitions the wider trace of the single-ended input line 402 to a narrower trace of a differential line 410. The other branch of the differential line 410 terminates at the balun 404. The balun 404 is illustrated as a square via pad that includes a via connect 408, which connects the via pad to the second dielectric layer 202-2. The differential lines 410 are connected to the conductive loop 116. The transition at the taper line 406 is generally less than a half wavelength to minimize the footprint and transmission loss.

The design parameters of the transition are the width and length of the differential lines 410, the gap in between the differential lines 410, and the taper line 406. The gap and width of the differential lines 410 are lower bounded by fabrication and manufacturing limits. Designers can fix one or several of the parameters while adjusting the other parameters to obtain the desired impedance matching. From the perspective of electromagnetics, the quasi-transverse electromagnetic (TEM) mode supported by the single-ended input line 402 is converted to the quasi-TEM differential or odd mode supported by the differential lines 410, whereas another common or even mode propagating along the differential lines 410 is suppressed. Specifically, the balun 404 and the taper line 406 gradually tilt the vertical electric potential between the microstrip and the ground plane toward the horizontal electric potential between the pair of differential lines 410; on the other hand, given the designed length of the differential lines 410, the forward-propagated common mode waves are canceled out by the reflected common mode waves because they are out of phase, which results in only the differential mode is allowed to propagate along the lines. In this way, the antenna-to-PCB transition 400 for single-ended configurations provides a compact differential-to-single ended transition that can maintain the bandwidth performance discussed above with minimal added insertion loss.

Example Method

Figure 5:
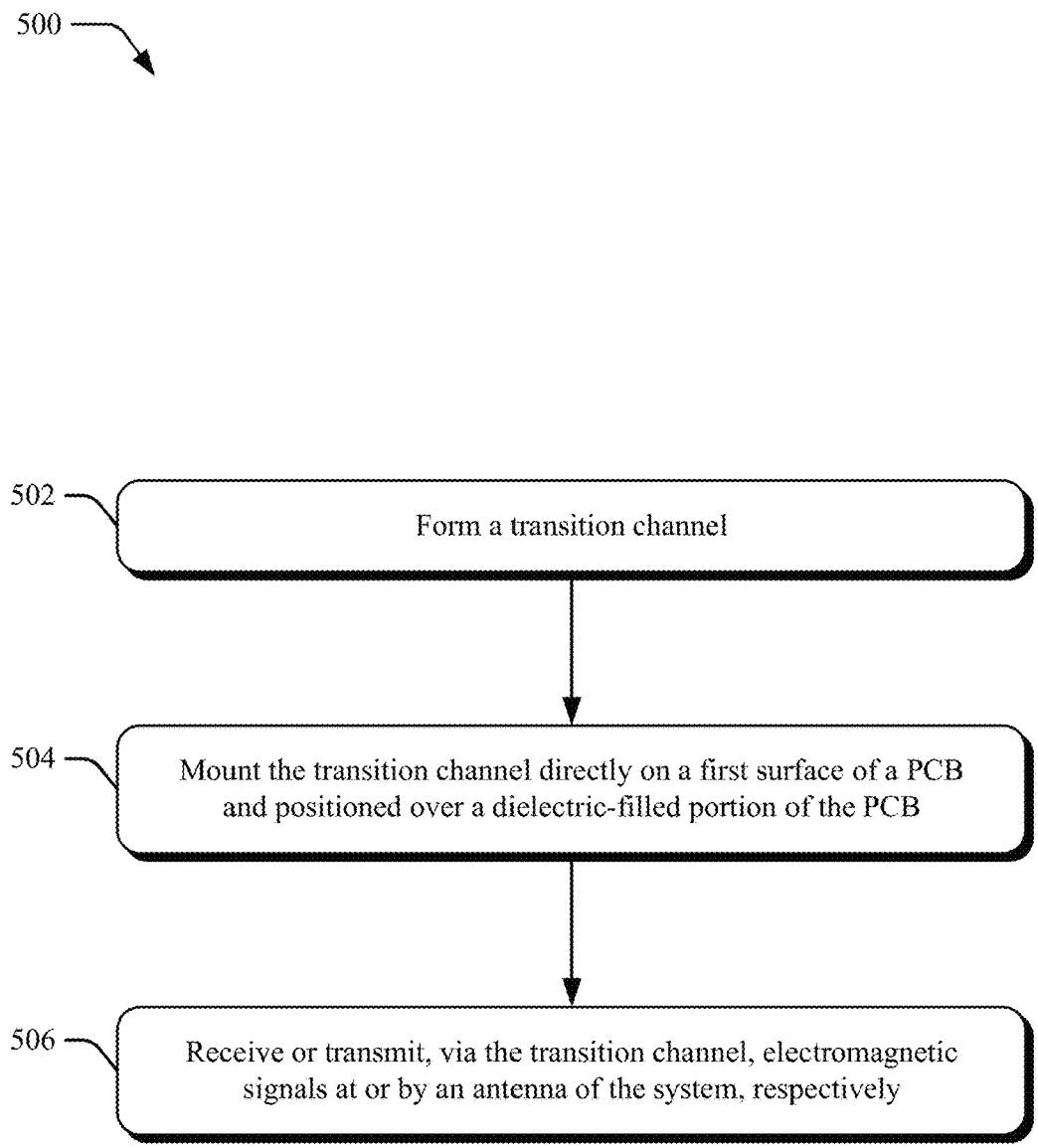
FIG. 5 illustrates an example method for manufacturing an antenna-to-PCB transition following techniques, apparatuses, and systems of this disclosure.

FIG. 5 illustrates an example method 500 for manufacturing an antenna-to-PCB transition following techniques, apparatuses, and systems of this disclosure. Method 500 is shown as sets of operations (or acts) performed, but not necessarily limited to the order or combinations in which the operations are shown herein. Further, any of one or more of the operations may be repeated, combined, or reorganized to provide other methods. In portions of the following discussion, reference may be made to the environment 100 of FIG. 1 and entities detailed in FIGS. 1 through 4, reference to which is made for example only. The techniques are not limited to performance by one entity or multiple entities.

At 502, a transition channel is formed. For example, the transition channel 118 can be stamped, etched, cut, machined, cast, molded, or formed in some other way. As one example, the transition channel 118 may be formed using a sheet-metal drawing process, which includes using tensile forces to stretch the metal material to a desired shape and thickness. The transition channel 118 may also be formed using a sheet-metal-stamping process, which includes applying pressure to the metal material by using a stamping press to form the desired shape and thickness. For complex shapes, the sheet-metal-stamping process may cost less than the sheet-metal-drawing process. The transition channel 118 may additionally be formed using a cast heatsink.

At 504, the transition channel is mounted directly on a first surface of a PCB and positioned over a dielectric-filled portion of the PCB. For example, the transition channel 118 is mounted directly on a first surface of the PCB 112, which can be a multi-layer PCB or a hybrid PCB stack-up. The transition channel 118 is connected to the first surface using a conductive material. The transition channel 118 is positioned over the dielectric-filled portion 114 of the PCB 112 and the conductive loop 116.

At 506, electromagnetic signals are received or transmitted via the transition channel at or by an antenna of the system, respectively. For example, the antenna receives or transmits signals and is routed via the transition channel 118 through the radar system 102 to or from the MIMIC.

EXAMPLES

In the following section, examples are provided.

Example 1: An apparatus comprising: a printed circuit board (PCB) comprising: at least one layer; a first surface and a second surface, the second surface positioned opposite and in parallel with the first surface; and a dielectric-filled portion of the PCB formed between the first surface and the second surface, the dielectric-filled portion being filled with a first dielectric; a conductive loop located on the first surface of the PCB and connected to a pair of lines; and a transition channel mounted on the first surface of the PCB and positioned over the dielectric-filled portion, the transition channel being filled with a second dielectric that is the same as or different from the first dielectric.

Example 2: The apparatus of example 1, wherein: the dielectric-filled portion is formed by at least one interface and a plate; the at least one interface has an interior opening that forms a cross-section of the dielectric-filled portion on the first surface; the plate encloses the dielectric-filled portion in a direction perpendicular to the first surface; and the at least one interface and the plate include multiple dielectric-filled via holes.

Example 3: The apparatus of example 2, wherein the dielectric-filled portion, the at least one interface, the interior opening, and the plate have an approximately rectangular shape.

Example 4: The apparatus of any one of the preceding examples, wherein dimensions of the dielectric-filled portion approximately match dimensions of an interior opening of the transition channel.

Example 5: The apparatus of any one of the preceding examples, wherein a depth of the dielectric-filled portion being approximately equal to a quarter wavelength of an operating frequency of an antenna coupled to the apparatus.

Example 6: The apparatus of any one of the preceding examples, wherein the conductive loop has an approximately circular, square, rectangular, or oval shape.

Example 7: The apparatus of any one of the preceding examples, wherein the pair of lines are differential input lines.

Example 8: The apparatus of any one of the preceding examples, wherein current flowing along the conductive loop induces magnetic fields to generate electromagnetic fields within the transition channel.

Example 9: The apparatus of example 8, wherein: a first portion of the electromagnetic fields travel through the dielectric-filled portion and reflect off a plate enclosing the dielectric-filled portion in a direction perpendicular to the first surface; and a second portion of the electromagnetic fields and the first portion of the electromagnetic fields after reflecting off the plate travel through the transition channel to an output port opposite the first surface of the PCB.

Example 10: The apparatus of example 9, wherein the output port is operably connected to an antenna input on another PCB.

Example 11: The apparatus of any one of the preceding examples, wherein the conductive loop has a perimeter length approximately equal to a wavelength of an operating frequency of an antenna coupled to the apparatus.

Example 12: The apparatus of any one of the preceding examples, wherein the conductive loop is located near a short wall of the transition channel.

Example 13: The apparatus of example 12, wherein the transition channel includes a hole in the short wall through which the pair of lines enter the transition channel.

Example 14: The apparatus of any one of the preceding examples, wherein a shape and trace width of the conductive loop is sized to impedance match to the pair of lines.

Example 15: The apparatus of any one of the preceding examples, wherein the second dielectric is air and the transition channel is an air waveguide.

Example 16: The apparatus of any one of the preceding examples, wherein the apparatus further includes an impedance port configured to impedance match to the conductive loop.

Example 17: The apparatus of any one of the preceding examples, wherein the pair of lines include a first line electrically coupled to a processor located on the PCB and a second line electrically coupled to a balun.

Example 18: The apparatus of example 17, wherein the first line includes a taper section that transitions the first line from a wider trace to a narrow trace before connecting to the conductive loop.

Example 19: The apparatus of example 18, wherein the taper section is less than a half wavelength of an operating frequency of an antenna coupled to the apparatus.

Example 20: The apparatus of any one of the preceding examples, wherein the transition channel comprises metal or metal-plated plastic.

CONCLUSION

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the scope of the disclosure as defined by the following claims.

What is claimed is:

1. An apparatus comprising:
   a printed circuit board (PCB) comprising:
      at least one layer;
      a first surface and a second surface, the second surface positioned opposite and in parallel with the first surface; and
      a dielectric-filled portion of the PCB formed between the first surface and the second surface, the dielectric-filled portion having a depth that is substantially equal to a quarter wavelength of an operating frequency of an antenna coupled to the apparatus and being filled with a first dielectric;
   a conductive loop located on the first surface of the PCB and connected to a pair of lines; and
   a transition channel mounted on the first surface of the PCB and positioned over the dielectric-filled portion, the transition channel being filled with a second dielectric that is the same as or different from the first dielectric.

2. The apparatus of claim 1, wherein:
   the dielectric-filled portion is formed by at least one interface and a plate;
   the at least one interface has an interior opening that forms a cross-section of the dielectric-filled portion on the first surface;
   the plate encloses the dielectric-filled portion in a direction perpendicular to the first surface; and
   the at least one interface and the plate include multiple dielectric-filled via holes.

3. The apparatus of claim 2, wherein the dielectric-filled portion, the at least one interface, the interior opening, and the plate have an approximately rectangular shape.

4. The apparatus of claim 1, wherein dimensions of the dielectric-filled portion approximately match dimensions of an interior opening of the transition channel.

5. The apparatus of claim 1, wherein the conductive loop has an approximately circular, square, rectangular, or oval shape.

6. The apparatus of claim 1, wherein the pair of lines are differential input lines.

7. The apparatus of claim 1, wherein current flowing along the conductive loop induces magnetic fields to generate electromagnetic fields within the transition channel.

8. The apparatus of claim 7, wherein:
   a first portion of the electromagnetic fields travel through the dielectric-filled portion and reflect off a plate enclosing the dielectric-filled portion in a direction perpendicular to the first surface; and
   a second portion of the electromagnetic fields and the first portion of the electromagnetic fields after reflecting off the plate travel through the transition channel to an output port opposite the first surface of the PCB.

9. The apparatus of claim 8, wherein the output port is operably connected to an antenna input on another PCB.

10. The apparatus of claim 1, wherein the conductive loop has a perimeter length approximately equal to a wavelength of an operating frequency of an antenna coupled to the apparatus.

11. The apparatus of claim 1, wherein the conductive loop is located near a short wall of the transition channel.

12. The apparatus of claim 11, wherein the transition channel includes a hole in the short wall through which the pair of lines enter the transition channel.

13. The apparatus of claim 1, wherein a shape and trace width of the conductive loop is sized to impedance match to the pair of lines.

14. The apparatus of claim 1, wherein the second dielectric is air and the transition channel is an air waveguide.

15. The apparatus of claim 1, wherein the apparatus further includes an impedance port configured to impedance match to the conductive loop.

16. The apparatus of claim 1, wherein the pair of lines include a first line electrically coupled to a processor located on the PCB and a second line electrically coupled to a balun.

17. The apparatus of claim 16, wherein the first line includes a taper section that transitions the first line from a wider trace to a narrow trace before connecting to the conductive loop.

18. The apparatus of claim 17, wherein the taper section is less than a half wavelength of an operating frequency of an antenna coupled to the apparatus.

19. The apparatus of claim 1, wherein the transition channel comprises metal or metal-plated plastic.

* * * * *